(12) United States Patent
Xiao et al.

(10) Patent No.: US 10,285,296 B2
(45) Date of Patent: May 7, 2019

(54) DISPLAY PANEL, FABRICATION METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Wenjun Xiao, Beijing (CN); Xiaochuan Chen, Beijing (CN); Yue Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 422 days.

(21) Appl. No.: 15/030,637

(22) PCT Filed: Jul. 20, 2015

(86) PCT No.: PCT/CN2015/084450
§ 371 (c)(1),
(2) Date: Apr. 20, 2016

(87) PCT Pub. No.: WO2016/165226
PCT Pub. Date: Oct. 20, 2016

(65) Prior Publication Data
US 2016/0381821 A1    Dec. 29, 2016

(30) Foreign Application Priority Data
Apr. 15, 2015    (CN) .......................... 2015 1 0179076

(51) Int. Cl.
*G02F 1/1339*    (2006.01)
*H05K 5/06*    (2006.01)
(Continued)

(52) U.S. Cl.
CPC .............. *H05K 5/062* (2013.01); *C09J 11/02* (2013.01); *C09J 11/04* (2013.01); *C09J 11/06* (2013.01);
(Continued)

(58) Field of Classification Search
CPC ............................ G02F 1/1339; G02F 1/1341
(Continued)

(56) References Cited

U.S. PATENT DOCUMENTS 3,959,571 A * 5/1976 Yahagi ................. B41M 5/1455
503/201
7,336,337 B2   2/2008 Kim et al.
(Continued)

FOREIGN PATENT DOCUMENTS

CN    1797078 A    7/2006
CN    103135282 A    6/2013
(Continued)

OTHER PUBLICATIONS

Second Chinese Office Action dated Sep. 21, 2017.
(Continued)

*Primary Examiner* — John A McPherson
(74) *Attorney, Agent, or Firm* — Dilworth & Barrese, LLP.; Michael J. Musella, Esq.

(57) ABSTRACT

A display panel, a fabrication method thereof and a display device are provided. The display panel has a display region (100) and a frame region (200). The display panel comprises an array substrate (01) and an opposed substrate (02) provided opposite to each other; a pattern of peripheral circuits and wires (03) is provided within the frame region (200) on a side of the array substrate (01) facing the opposed substrate (02), a pattern of a black matrix (04) is provided on the side of the array substrate (01) facing the opposed substrate (02) and/or on a side of the opposed substrate (02) facing the
(Continued)

array substrate (01), and an orthogonal projection of the pattern of the peripheral circuits and wires (03) on the array substrate (01) does not overlap an orthogonal projection of the pattern of the black matrix (04) on the array substrate (01); and a sealant (05) which has underwent a curing treatment is provided in the frame region (200) and between the array substrate (01) and the opposed substrate (02), and the sealant (05) includes a substance formed of a thermochromic material which has changed its color in a process of the curing treatment.

18 Claims, 3 Drawing Sheets

(51) Int. Cl.
| | | |
|---|---|---|
| *G02F 1/1335* | (2006.01) | |
| *G02F 1/1341* | (2006.01) | |
| *C09J 11/04* | (2006.01) | |
| *C09J 11/06* | (2006.01) | |
| *H05K 5/00* | (2006.01) | |
| *C09J 11/02* | (2006.01) | |
| *C08K 3/38* | (2006.01) | |
| *C08K 5/18* | (2006.01) | |

(52) U.S. Cl.
CPC .......... *G02F 1/1335* (2013.01); *G02F 1/1339* (2013.01); *G02F 1/1341* (2013.01); *H05K 5/0017* (2013.01); *C08K 3/38* (2013.01); *C08K 5/18* (2013.01); *C09J 2203/326* (2013.01); *C09J 2205/102* (2013.01)

(58) Field of Classification Search
USPC .......................... 349/153, 190; 430/320, 321
See application file for complete search history.

(56) References Cited

U.S. PATENT DOCUMENTS

| | | | | |
|---|---|---|---|---|
| 2003/0081155 | A1* | 5/2003 | Moon | ............... G02F 1/133512 349/106 |
| 2007/0030437 | A1 | 2/2007 | Kim et al. | |

FOREIGN PATENT DOCUMENTS

| | | | |
|---|---|---|---|
| CN | 10402587 A | | 9/2014 |
| CN | 104267526 A | | 1/2015 |
| CN | 104730739 A | | 6/2015 |
| JP | 57-093197 A | * | 6/1992 |
| JP | 2006243018 A | * | 9/2006 |
| JP | 2006317520 A | | 11/2006 |
| JP | 2012088412 A | | 5/2012 |
| TW | 200530327 A | | 9/2005 |
| TW | 201400952 A | | 1/2014 |

OTHER PUBLICATIONS

Search Report and Written Opinion dated Jan. 22, 2016 from State Intellectual Property Office of the P.R. China.
First Chinese Office Action dated Feb. 28, 2017.

\* cited by examiner

DISPLAY PANEL, FABRICATION METHOD THEREOF AND DISPLAY DEVICE

TECHNICAL FIELD

Embodiments of the present disclosure relate to a display panel, a fabrication method thereof and a display device.

BACKGROUND

Nowadays, a narrow frame design has become a major trend in a display field because of its appearance aesthetics, low cost, and very core role in a large-sized mosaic design, and many manufacturers are in pursuit of the narrow frame design.

Currently, most display panels are Gate Driver on Array (GOA) panels, in which a gate driver for driving a gate line is provided in a frame region of an array substrate of the display panel. Some periphery lines are further provided in the frame region.

Figure 1:
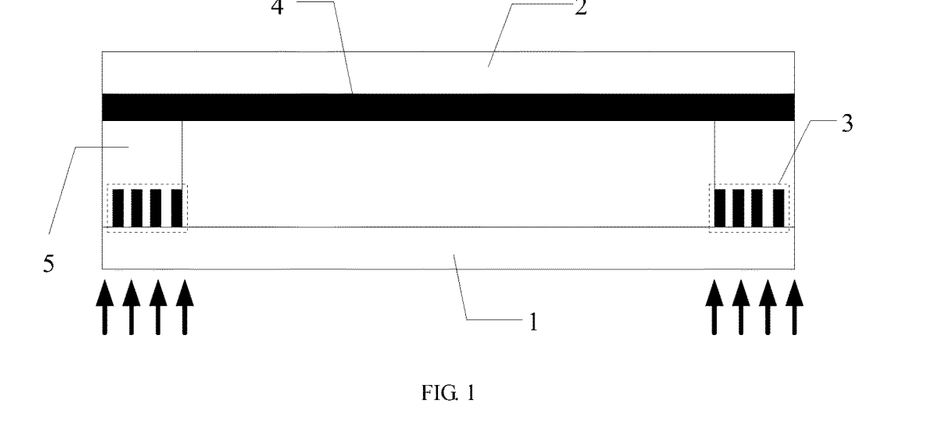
FIG. 1 is a structural schematic view illustrating a display panel according to on technique.

For example, as shown in FIG. 1, the display panel comprises the array substrate 1 and the color filter substrate 2, the array substrate 1 is provided with the gate driver 3 and the periphery lines (not shown in FIG. 1) in the frame region, the color filter substrate 2 is provided with a black matrix 4 in the display region and the frame region on a side facing the array substrate 1, and a sealant 5 is provided in the frame region and between the array substrate 1 and the color filter substrate 2. The sealant 5 is irradiated by ultraviolet light so that the sealant 5 is cured.

In the display panel of the above-described structure, since the black matrix 4 for preventing light leakage of the display panel is provided in the frame region of the color filter substrate 2, it is necessary to irradiate the ultraviolet light to the sealant 5 from the array substrate 1 side in order to cure the sealant 5. In order to guarantee that enough light passes through the array substrate 1 in the case of irradiating the ultraviolet light on the sealant 5 from the array substrate 1 side so as to cure the sealant 5, it is necessary to provide a wide gap in a region where the gate driver 3 is provided and to provide a wide gap between the periphery lines, and as a result, a space occupied by the gate driver 3 and the periphery lines becomes wider, which is not conducive to achieve the narrow frame of the display panel.

SUMMARY

According to embodiments of the present disclosure, there is provided a display panel. The display panel has a display region and a frame region. The display panel comprises an array substrate and an opposed substrate provided opposite to each other; a pattern of peripheral circuits and wires is provided within the frame region on a side of the array substrate facing the opposed substrate, a pattern of a black matrix is provided on the side of the array substrate facing the opposed substrate and/or on a side of the opposed substrate facing the array substrate, and an orthogonal projection of the pattern of the peripheral circuits and wires on the array substrate does not overlap an orthogonal projection of the pattern of the black matrix on the array substrate; and a sealant which has underwent a curing treatment is provided in the frame region and between the array substrate and the opposed substrate, and the sealant includes a substance formed of a thermochromic material which has changed its color in a process of the curing treatment.

For example, the sealant includes a black substance formed of the thermochromic material which has changed its color in the process of the curing treatment.

For example, the thermochromic material includes a chromogenic agent and a color developing agent.

For example, the chromogenic agent is an organic black fluorane functional material.

For example, the organic black fluorane functional material is 2-anilino-3-methyl-6-diethylamino fluorane.

For example, the color developing agent is boric acid.

For example, the black matrix is provided only in the display region; or the black matrix is provided in other regions than a region where the pattern of the peripheral circuits and wires is provided.

For example, the curing treatment includes: a thermo-curing treatment, during which a color of the thermochromic material in the sealant is changed; and a photo-curing treatment, during which the sealant is cured.

For example, the photo-curing treatment includes: in the case that the black matrix is provided only in the display region, the sealant is irradiated by using a ultraviolet light from the opposed substrate to perform the photo-curing treatment on the sealant; in the case that the black matrix is provided in other regions than a region where the pattern of the peripheral circuits and wires is provided and is provided on the side of the opposed substrate facing the array substrate, the sealant provided within the region where the pattern of the peripheral circuits and wires is provided is irradiated by using the ultraviolet light from the opposed substrate and the sealant provided in other regions than the region where the pattern of the peripheral circuits and wires is provided is irradiated by using the ultraviolet light from the array substrate; and in the case that the black matrix is provided in other regions than the region where the pattern of the peripheral circuits and wires is provided and is provided on the side of the array substrate facing the opposed substrate, the sealant provided within the region where the pattern of the peripheral circuits and wires is provided is irradiated by using the ultraviolet light from the opposed substrate and the sealant provided in other regions than the region where the pattern of the peripheral circuits and wires is provided is irradiated by using the ultraviolet light from the opposed substrate.

For example, a temperature for performing the thermo-curing treatment on the sealant is 100° C. to 180° C.

For example, the temperature for performing the thermo-curing treatment on the sealant is 130° C.

According to the embodiments of the present disclosure, there is provided a display device, comprising the display panel as described above.

According to an embodiment of the present disclosure, there is provided a fabrication method of a display panel. The method comprises: forming an array substrate and an opposed substrate provided opposite to each other; wherein, a pattern of peripheral circuits and wires is provided within a frame region on a side of the array substrate facing the opposed substrate, a pattern of a black matrix is provided on the side of the array substrate facing the opposed substrate or on a side of the opposed substrate facing the array substrate; and an orthogonal projection of the pattern of the peripheral circuits and wires on the array substrate does not overlap an orthogonal projection of the pattern of the black matrix on the array substrate; forming a sealant in the frame region on the side of the array substrate facing the opposed substrate or in the frame region on the side of the opposed substrate facing the array substrate, wherein, the sealant includes a thermochromic material; performing a curing treatment on the sealant, so that a color of the thermochromic material in the sealant is changed and the sealant is cured.

For example, the sealant includes a black substance formed of the thermochromic material which has changed its color in a process of the curing treatment.

For example, the thermochromic material includes a chromogenic agent and a color developing agent.

For example, the chromogenic agent is an organic black fluorane functional material.

For example, the organic black fluorane functional material is 2-anilino-3-methyl-6-diethylamino fluorane.

For example, the color developing agent is boric acid.

For example, the black matrix is provided only in the display region; or the black matrix is provided in other regions than a region where the pattern of the peripheral circuits and wires is provided.

For example, the curing treatment includes: a thermo-curing treatment, during which a color of the thermochromic material in the sealant is changed; and a photo-curing treatment, during which the sealant is cured.

For example, the photo-curing treatment includes: in the case that the black matrix is provided only in the display region, the sealant is irradiated by using a ultraviolet light from the opposed substrate to perform the photo-curing treatment on the sealant; in the case that the black matrix is provided in other regions than a region where the pattern of the peripheral circuits and wires is provided and is provided on the side of the opposed substrate facing the array substrate, the sealant provided within the region where the pattern of the peripheral circuits and wires is provided is irradiated by using the ultraviolet light from the opposed substrate and the sealant provided in other regions than the region where the pattern of the peripheral circuits and wires is provided is irradiated by using the ultraviolet light from the array substrate; and in the case that the black matrix is provided in other regions than the region where the pattern of the peripheral circuits and wires is provided and is provided on the side of the array substrate facing the opposed substrate, the sealant provided within the region where the pattern of the peripheral circuits and wires is provided is irradiated by using the ultraviolet light from the opposed substrate and the sealant provided in other regions than the region where the pattern of the peripheral circuits and wires is provided is irradiated by using the ultraviolet light from the opposed substrate.

For example, a temperature for performing the thermo-curing treatment on the sealant is 100° C. to 180° C.

For example, the temperature for performing the thermo-curing treatment on the sealant is 130° C.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make the objective, technical solutions, and advantages of the present disclosure clearer, the technical solutions in the embodiments of the present disclosure are described more clearly and completely hereinafter in conjunction with the accompanying drawings. It is obvious that the described embodiments are just a part but not all of the embodiments of the present disclosure. Based on the described embodiments of the present disclosure, those ordinarily skilled in the art can obtain other embodiment(s), without any inventive work, which should be within the protective scope of the present disclosure.

Shapes and sizes of respective components in the accompanying drawings do not reflect true shapes and sizes, but are only intended to illustrate content of the embodiments of the present disclosure.

Figure 2:
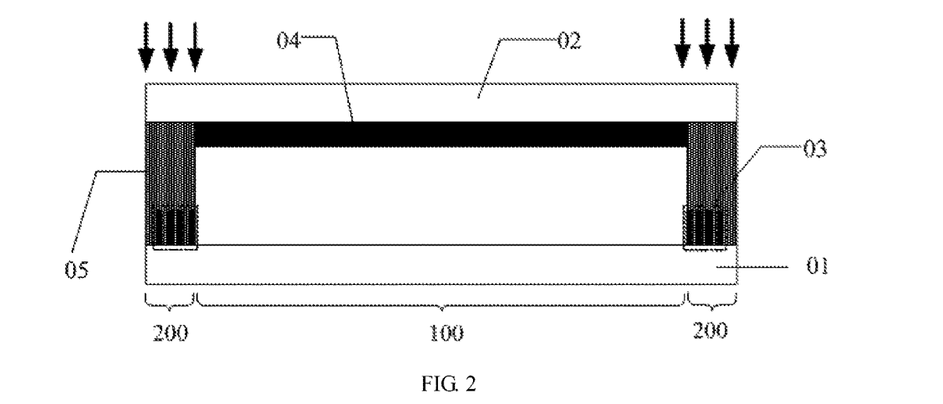
FIG. 2 is a cross-sectional structural schematic view illustrating a display panel according to embodiments of the present disclosure.

Embodiments of the present disclosure provide a display panel. As shown in FIG. 2, the display panel comprises a display region 100 and a frame region 200 surrounding the display region 100. Further, as shown in FIG. 2, the display panel comprises an array substrate 01 and an opposed substrate 02 provided opposite to each other. A pattern of peripheral circuits and wires 03 is provided within the frame region on a side of the array substrate 01 facing the opposed substrate 02, a pattern of a black matrix 04 is provided on the side of the array substrate 01 facing the opposed substrate 02 and/or on a side of the opposed substrate 02 facing the array substrate 01; an orthogonal projection of the pattern of the peripheral circuits and wires 03 on the array substrate 01 does not overlap an orthogonal projection of the pattern of the black matrix 04 on the array substrate; and a sealant 05 which has underwent a curing treatment is provided in the frame region and between the array substrate 01 and the opposed substrate 02, and the sealant 05 includes a substance formed of a thermochromic material which has changed its color in a process of the curing treatment.

For example, the peripheral circuits and wires 03 include a driving circuit and/or periphery lines.

In the above-described display panel according to the embodiments of the present disclosure, in the frame region, the orthogonal projection of the pattern of the peripheral circuits and wires on the array substrate does not overlap the orthogonal projection of the pattern of the black matrix on the array substrate; that is, the black matrix is not provided in a region where the pattern of the peripheral circuits and wires is provided. By such design, in the case that the sealant is subjected to the curing treatment, it is not necessary to irradiated ultraviolet light from the array substrate for the region where the pattern of the peripheral circuits and wires is provided, so as to reduce a gap width in the pattern of the peripheral circuits and wires, to reduce a width of the frame region and to achieve a narrow-frame display panel. In addition, since the sealant includes the substance formed of the thermochromic material which has changed its color in the process of the curing treatment, although the above-described display panel is not provided with the black matrix in the region where the pattern of the peripheral circuits and wires is provided, the sealant per se which has underwent the curing treatment plays a role in preventing light leakage of the display panel.

Figure 3A:
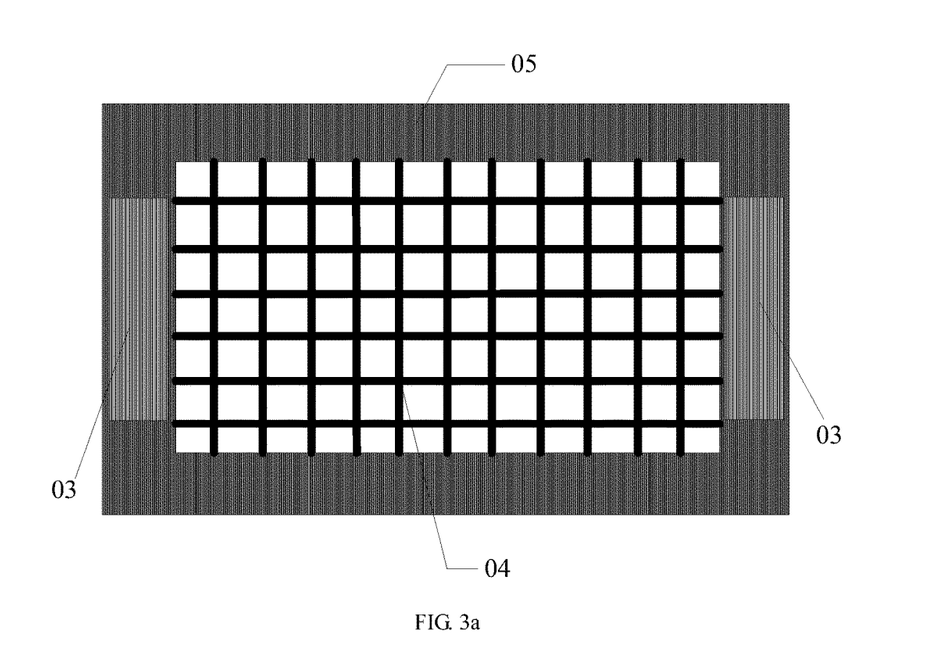
FIG. 3a is a planar structural schematic view I illustrating the display panel according to the embodiments of the present disclosure.

For example, in the above-described display panel according to the embodiments of the present disclosure, as shown in FIG. 3a, the black matrix 04 is provided only in the display region, that is, the black matrix 04 is not provided in the frame region. In FIG. 3a, the black matrix in the display region is of grid-like shape; however, the pattern of the black matrix in the display region is not limited thereto, which is not limited by the embodiments of the present disclosure.

Figure 3B:
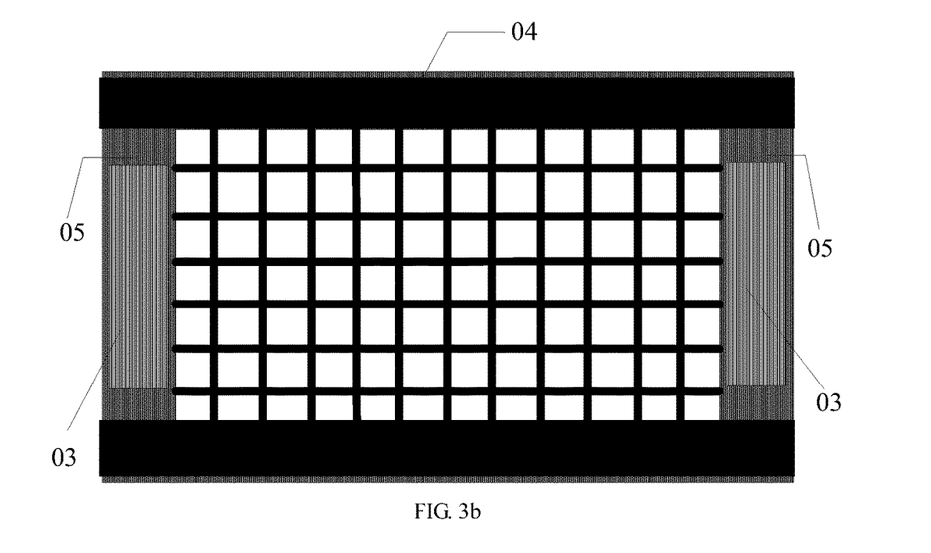
FIG. 3b is a planar structural schematic view II illustrating the display panel according to the embodiments of the present disclosure.

For example, in the above-described display panel according to the embodiments of the present disclosure, as shown in FIG. 3b, the black matrix 04 is not provided in the region where the pattern of the peripheral circuits and wires 03 is provided in the frame region, and the black matrix 04 is provided in the display region and other regions of the frame region. The pattern of the black matrix in the display region is not limited here.

For example, in the above-described display panel according to the embodiments of the present disclosure, the thermochromic material includes a chromogenic agent and a color developing agent. For example, the chromogenic agent decides the color, and a content of the color developing agent decides a color depth; contents of the chromogenic agent and the color developing agent are determined according to a practical requirement.

For example, in the above-described display panel according to the embodiments of the present disclosure, the chromogenic agent is an organic black fluorane functional material, or other similar functional materials, which is not limited here.

For example, in the above-described display panel according to the embodiments of the present disclosure, the organic black fluorane functional material is 2-anilino-3-methyl-6-diethylamino fluorane, i.e., organic black fluorane TF-BL1, whose chemical structural formula is as shown in Formula 1:

Formula 1

For example, in the above-described display panel according to the embodiments of the present disclosure, the color developing agent is formed of boric acid, whose chemical structural formula is as shown in Formula 2:

Formula 2

For example, in the above-described display panel according to the embodiments of the present disclosure, in the case where the chromogenic agent is 2-anilino-3-methyl-6-diethylamino fluorane and the color developing agent is boric acid, 2-anilino-3-methyl-6-diethylamino fluorane and boric acid are heated during the sealant is cured by a thermo-curing treatment, and a formula of chemical reaction between 2-anilino-3-methyl-6-diethylamino fluorane and boric acid is as shown in Formula 3:

Formula 3

Colorless 2-anilino-3-methyl-6-diethylamino fluorane and boric acid in the sealant become black after the thermo-curing treatment, so that the sealant becomes black, which can effectively prevent the display panel from light leakage.

For example, the curing treatment includes: a thermo-curing treatment, during which the color of the thermochromic material in the sealant is changed; and a photo-curing treatment, during which the sealant is cured. Firstly, the thermo-curing treatment is performed on the sealant, to ensure adequate reaction of the thermochromic material in the thermo-curing process, so that the color of the thermochromic material is changed; and then, the photo-curing treatment is performed on the sealant which has underwent the thermo-curing treatment by using the ultraviolet light, so that the sealant which has underwent the thermo-curing treatment is cured.

For example, the thermo-curing treatment refers to a process of heating the sealant including the thermochromic material in any mode, which is not limited here.

For example, in the above-described display panel according to the embodiments of the present disclosure, the temperature for performing the thermo-curing treatment on the sealant is controlled between 100° C. and 180° C. In the case that the temperature is too low, a temperature for the thermochromic material to change its color is not reached; and in the case that the temperature is too high, although a reaction rate is accelerated, yet an excessively high temperature is apt to make a surface of the sealant to become uneven. Further, for example, the temperature for performing the thermo-curing treatment on the sealant is controlled around 130° C.

For example, in the above-described display panel according to the embodiments of the present disclosure, the performing the photo-curing treatment on the sealant which has underwent the thermo-curing treatment by using the ultraviolet light includes:

in the case that the black matrix is provided only in the display region, the sealant is irradiated by using the ultraviolet light from the opposed substrate to perform the photo-curing treatment on the sealant, to ensure that the sealant is adequately irradiated by the ultraviolet light, so that the sealant is completely cured;

in the case that the black matrix is provided in other regions than the region where the pattern of the peripheral circuits and wires is provided and is provided on the side of the opposed substrate facing the array substrate, the sealant provided within the region where the pattern of the peripheral circuits and wires is provided is irradiated by using the ultraviolet light from the opposed substrate and the sealant provided in other regions than the region where the pattern of the peripheral circuits and wires is provided is irradiated by using the ultraviolet light from the array substrate, to ensure that the sealant is adequately irradiated by the ultraviolet light, so that the sealant is completely cured; and in the case that the black matrix is provided in other regions than the region where the pattern of the peripheral circuits and wires is provided and is provided on the side of the array substrate facing the opposed substrate, the sealant provided within the region where the pattern of the peripheral circuits and wires is provided is irradiated by using the ultraviolet light from the opposed substrate and the sealant provided in other regions than the region where the pattern of the peripheral circuits and wires is provided is irradiated by using the ultraviolet light from the opposed substrate, to ensure that the sealant is adequately irradiated by the ultraviolet light, so that the sealant is completely cured.

The embodiments of the present disclosure further provide a display device, comprising the above-described display panel according to the embodiments of the present disclosure. For example, implementation of the display device is similar to implementation of the above-described display panel, which will not be repeated here.

For example, the display device according to the embodiments of the present disclosure is any product or component having a display function, such as a mobile phone, a tablet computer, a television, a monitor, a laptop computer, a digital photo frame or a navigator, which is not limited here.

Figure 4:
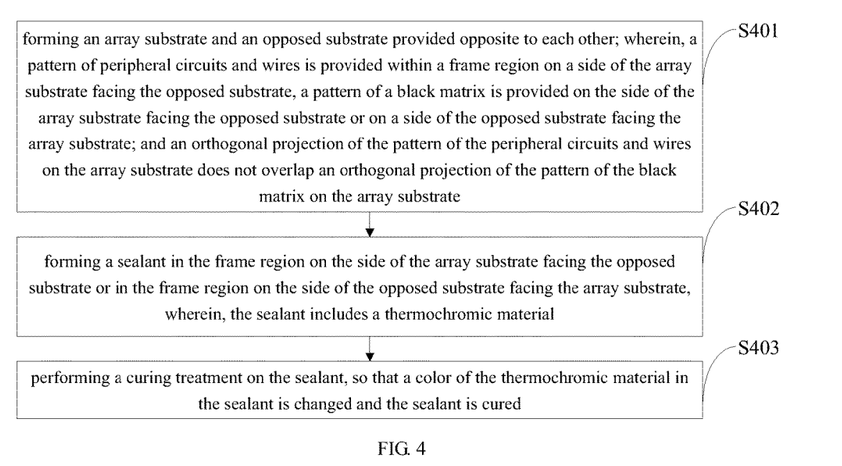
FIG. 4 is a flow chart illustrating a fabrication method of a display panel according to the embodiments of the present disclosure.

The embodiments of the present disclosure further provide a fabrication method of a display panel, as shown in FIG. 4, the fabrication method comprising steps of:

S401: forming an array substrate and an opposed substrate provided opposite to each other;

A pattern of peripheral circuits and wires is provided within a frame region on a side of the array substrate facing the opposed substrate, a pattern of a black matrix is provided on the side of the array substrate facing the opposed substrate or on a side of the opposed substrate facing the array substrate; and an orthogonal projection of the pattern of the peripheral circuits and wires on the array substrate does not overlap an orthogonal projection of the pattern of the black matrix on the array substrate.

S402: forming a sealant in the frame region on the side of the array substrate facing the opposed substrate, or in the frame region on the side of the opposed substrate facing the array substrate;

For example, the sealant includes a thermochromic material. For example, the sealant is formed by a coating method.

S403: performing a curing treatment on the sealant, so that a color of the thermochromic material in the sealant is changed and the sealant is cured.

In the above-described fabrication method according to the embodiments of the present disclosure, in the frame region, the orthogonal projection of the pattern of the peripheral circuits and wires on the array substrate does not overlap the orthogonal projection of the pattern of the black matrix on the array substrate; that is, the black matrix is not provided in the region where the pattern of the peripheral circuits and wires is provided. By such design, in the case that the sealant is subjected to the curing treatment, it is not necessary to irradiated ultraviolet light from the array substrate for the region where the pattern of the peripheral circuits and wires is provided, so as to reduce a gap width in the pattern of the peripheral circuits and wires, to reduce a width of the frame region and to achieve a narrow-frame display panel. In addition, since the sealant includes the substance formed of the thermochromic material which has changed its color in the process of the curing treatment, although the above-described display panel is not provided with the black matrix in the region where the pattern of the peripheral circuits and wires is provided, the sealant per se which has underwent the curing treatment plays a role in preventing light leakage of the display panel.

For example, in the above-described fabrication method according to the embodiments of the present disclosure, step S403 of performing the curing treatment on the sealant is performed after the array substrate and the opposed substrate are provided opposite to each other.

For example, in the above-described fabrication method according to the embodiments of the present disclosure, step S403 of performing the curing treatment on the sealant includes:

performing a thermo-curing treatment on the sealant, so that the color of the thermochromic material in the sealant is changed;

performing a photo-curing treatment on the sealant which has underwent the thermo-curing treatment by using ultraviolet light, so that the sealant which has underwent the thermo-curing treatment is completely cured. Firstly, the thermo-curing treatment is performed on the sealant, to ensure adequate reaction of the thermochromic material in the thermo-curing process, so that the color of the thermochromic material is changed; and then, the photo-curing treatment is performed on the sealant which has underwent the thermo-curing treatment by using the ultraviolet light, so that the sealant which has underwent the thermo-curing treatment is completely cured.

For example, the thermo-curing treatment refers to a process of heating the sealant including the thermochromic material in any mode, which is not limited here.

For example, in the above-described fabrication method according to the embodiments of the present disclosure, the performing the photo-curing treatment on the sealant which has underwent the thermo-curing treatment by using the ultraviolet light includes:

in the case that the black matrix is provided only in the display region, the sealant is irradiated by using the ultraviolet light from the opposed substrate to perform the photo-curing treatment on the sealant, to ensure that the sealant is adequately irradiated by the ultraviolet light, so that the sealant is completely cured;

in the case that the black matrix is provided in other regions than the region where the pattern of the peripheral circuits and wires is provided and is provided on the side of the opposed substrate facing the array substrate, the sealant provided within the region where the pattern of the peripheral circuits and wires is provided is irradiated by using the ultraviolet light from the opposed substrate and the sealant provided in other regions than the region where the pattern of the peripheral circuits and wires is provided is irradiated by using the ultraviolet light from the array substrate, to ensure that the sealant is adequately irradiated by the ultraviolet light, so that the sealant is completely cured; and in the case that the black matrix is provided in other regions than the region where the pattern of the peripheral circuits and wires is provided and is provided on the side of the array substrate facing the opposed substrate, the sealant provided within the region where the pattern of the peripheral circuits and wires is provided is irradiated by using the ultraviolet light from the opposed substrate and the sealant provided in other regions than the region where the pattern of the peripheral circuits and wires is provided is irradiated by using the ultraviolet light from the opposed substrate, to ensure that the sealant is adequately irradiated by the ultraviolet light, so that the sealant is completely cured.

For example, in the above-described fabrication method according to the embodiments of the present disclosure, the thermochromic material includes a chromogenic agent and a color developing agent. For example, the chromogenic agent decides the color, and a content of the color developing agent decides a color depth; and contents of the chromogenic agent and the color developing agent are determined according to a practical requirement.

For example, in the above-described fabrication method according to the embodiments of the present disclosure, the chromogenic agent is an organic black fluorane functional material, which is not limited here.

For example, in the above-described fabrication method according to the embodiments of the present disclosure, the organic black fluorane functional material is 2-anilino-3-methyl-6-diethylamino fluorane, i.e., organic black fluorane TF-BL1.

For example, in the above-described fabrication method according to the embodiments of the present disclosure, the color developing agent is formed of boric acid, which is not limited here.

For example, in the above-described fabrication method according to the embodiments of the present disclosure, the temperature for performing the thermo-curing treatment on the sealant is controlled between 100° C. and 180° C. In the case that the temperature is too low, a temperature for the thermochromic material to change its color is not reached; and in the case that the temperature is too high, although a reaction rate is accelerated, yet an excessively high temperature is apt to make a surface of the sealant to become uneven. Further, for example, the temperature for performing the thermo-curing treatment on the sealant is controlled around 130° C.

For example, in the above-described fabrication method according to the embodiments of the present disclosure, in the case where the chromogenic agent is 2-anilino-3-methyl-6-diethylamino fluorane and the color developing agent is boric acid, colorless 2-anilino-3-methyl-6-diethylamino fluorane and boric acid in the sealant become black after the thermo-curing treatment, so that the sealant becomes black, which can effectively prevent the display panel from light leakage.

For example, in the above-described fabrication method according to the embodiments of the present disclosure, in a process of step S401 of forming the array substrate and the opposed substrate opposite to each other, a planarization layer is provided on the side of the array substrate facing the opposed substrate and another planarization layer is provided on the side of the opposed substrate facing the array substrate. For example, the planarization layers are not provided in the frame region, so as to ensure that the sealant is adequately irradiated by the ultraviolet light.

In the display panel, the fabrication method thereof and the display device according to the embodiments of the present disclosure, in the frame region, the orthogonal projection of the pattern of the peripheral circuits and wires on the array substrate does not overlap the orthogonal projection of the pattern of the black matrix on the array substrate; that is, the black matrix is not provided in the region where the pattern of the peripheral circuits and wires is provided. By such design, in the case that the sealant is subjected to the curing treatment, it is not necessary to irradiated ultraviolet light from the array substrate for the region where the pattern of the peripheral circuits and wires is provided, so as to reduce a gap width in the pattern of the peripheral circuits and wires, to reduce a width of the frame region and to achieve a narrow-frame display panel. In addition, since the sealant includes the substance formed of the thermochromic material which has changed its color in the process of the curing treatment, although the above-described display panel is not provided with the black matrix in the region where the pattern of the peripheral circuits and wires is provided, the sealant per se which has underwent the curing treatment plays a role in preventing light leakage of the display panel.

The foregoing embodiments merely are exemplary embodiments of the present disclosure, and not intended to define the scope of the present disclosure, and the scope of the disclosure is determined by the appended claims.

The present application claims priority of Chinese Patent Application No. 201510179076.X filed on Apr. 15, 2015, the disclosure of which is incorporated herein by reference in its entirety as part of the present application.

The invention claimed is:

1. A display panel, comprising a display region and a frame region, wherein
   the display panel comprises an array substrate and an opposed substrate provided opposite to each other;
   a pattern of peripheral circuits and wires is provided within the frame region on a side of the array substrate facing the opposed substrate, a pattern of a black matrix is provided on the side of the array substrate facing the opposed substrate and/or on a side of the opposed substrate facing the array substrate, and an orthogonal projection of the pattern of the peripheral circuits and wires on the array substrate does not overlap an orthogonal projection of the pattern of the black matrix on the array substrate;
   a sealant which has underwent a curing treatment is provided in the frame region and between the array substrate and the opposed substrate, and the sealant includes a substance formed of a thermochromic material which has changed its color in a process of the curing treatment;
   the sealant includes a black substance formed of the thermochromic material which has changed its color in the process of the curing treatment; and
   the black matrix is in direct contact with the sealant.

2. The display panel according to claim 1, wherein the thermochromic material includes a chromogenic agent and a color developing agent.

3. The display panel according to claim 2, wherein the chromogenic agent is an organic black fluorane functional material.

4. The display panel according to claim 3, wherein the organic black fluorane functional material is 2-anilino-3-methyl-6-diethylamino fluorane.

5. The display panel according to claim 4, wherein the color developing agent is boric acid.

6. The display panel according to claim 1, wherein
the black matrix is provided only in the display region; or
the black matrix is provided in other regions than a region where the pattern of the peripheral circuits and wires is provided.

7. The display panel according to claim 1, wherein the curing treatment includes: a thermo-curing treatment, during which a color of the thermochromic material in the sealant is changed; and a photo-curing treatment, during which the sealant is cured.

8. A display device, comprising the display panel according to claim 1.

9. A fabrication method of a display panel, comprising:
forming an array substrate and an opposed substrate provided opposite to each other; wherein, a pattern of peripheral circuits and wires is provided within a frame region on a side of the array substrate facing the opposed substrate, a pattern of a black matrix is provided on the side of the array substrate facing the opposed substrate or on a side of the opposed substrate facing the array substrate; and an orthogonal projection of the pattern of the peripheral circuits and wires on the array substrate does not overlap an orthogonal projection of the pattern of the black matrix on the array substrate;
forming a sealant in the frame region on the side of the array substrate facing the opposed substrate or in the frame region on the side of the opposed substrate facing the array substrate, wherein, the sealant includes a thermochromic material; and
performing a curing treatment on the sealant, so that a color of the thermochromic material in the sealant is changed and the sealant is cured, and the sealant includes a black substance formed of the thermochromic material which has changed its color in the process of the curing treatment,
wherein the black matrix is in direct contact with the sealant.

10. The fabrication method according to claim 9, wherein the thermochromic material includes a chromogenic agent and a color developing agent.

11. The fabrication method according to claim 10, wherein the chromogenic agent is an organic black fluorane functional material.

12. The fabrication method according to claim 11, wherein the organic black fluorane functional material is 2-anilino-3-methyl-6-diethylamino fluorane.

13. The fabrication method according to claim 12, wherein the color developing agent is boric acid.

14. The fabrication method according to claim 9, wherein
the black matrix is provided only in the display region; or
the black matrix is provided in other regions than a region where the pattern of the peripheral circuits and wires is provided.

15. The fabrication method according to claim 9, wherein the curing treatment includes: a thermo-curing treatment, during which a color of the thermochromic material in the sealant is changed; and a photo-curing treatment, during which the sealant is cured.

16. The fabrication method according to claim 15, wherein the photo-curing treatment includes:
in the case that the black matrix is provided only in the display region, the sealant is irradiated by using a ultraviolet light from the opposed substrate to perform the photo-curing treatment on the sealant;
in the case that the black matrix is provided in other regions than a region where the pattern of the peripheral circuits and wires is provided and is provided on the side of the opposed substrate facing the array substrate, the sealant provided within the region where the pattern of the peripheral circuits and wires is provided is irradiated by using the ultraviolet light from the opposed substrate and the sealant provided in other regions than the region where the pattern of the peripheral circuits and wires is provided is irradiated by using the ultraviolet light from the array substrate; and
in the case that the black matrix is provided in other regions than the region where the pattern of the peripheral circuits and wires is provided and is provided on the side of the array substrate facing the opposed substrate, the sealant provided within the region where the pattern of the peripheral circuits and wires is provided is irradiated by using the ultraviolet light from the opposed substrate and the sealant provided in other regions than the region where the pattern of the peripheral circuits and wires is provided is irradiated by using the ultraviolet light from the opposed substrate.

17. The fabrication method according to claim 15, wherein a temperature for performing the thermo-curing treatment on the sealant is 100° C. to 180° C.

18. The fabrication method according to claim 17, wherein the temperature for performing the thermo-curing treatment on the sealant is 130° C.

* * * * *